United States Patent
Park et al.

(10) Patent No.: US 11,719,528 B2
(45) Date of Patent: Aug. 8, 2023

(54) MAGNETO-RESISTIVE ANGLE SENSOR SYSTEM AND A VEHICLE COMPRISING A MAGNETO-RESISTIVE ANGLE SENSOR SYSTEM

(71) Applicant: Infineon Technologies AG, Neubiberg (DE)

(72) Inventors: Joo Il Park, Sungnam (KR); Hyun Jeong Kim, Seoul (KR); Sehwan Kim, Suwon-Si (KR)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/540,423

(22) Filed: Dec. 2, 2021

(65) Prior Publication Data

US 2022/0187054 A1 Jun. 16, 2022

(30) Foreign Application Priority Data

Dec. 10, 2020 (DE) .......................... 102020133041.3

(51) Int. Cl.
| | | |
|---|---|---|
| *G01R 33/30* | (2006.01) | |
| *G01B 7/30* | (2006.01) | |
| *G01R 33/09* | (2006.01) | |

(52) U.S. Cl.
CPC ............. *G01B 7/30* (2013.01); *G01R 33/091* (2013.01); *G01R 33/093* (2013.01); *G01R 33/096* (2013.01); *G01R 33/098* (2013.01)

(58) Field of Classification Search
CPC ....... G01B 7/30; G01R 33/091; G01R 33/093
See application file for complete search history.

(56) References Cited

U.S. PATENT DOCUMENTS

| | | | |
|---|---|---|---|
| 2008/0231262 A1* | 9/2008 | Wolf | G01D 5/145 324/207.2 |
| 2012/0038348 A1 | 2/2012 | Aimuta et al. | |
| 2012/0038351 A1* | 2/2012 | Saruki | G01D 5/145 324/207.25 |
| 2012/0256619 A1* | 10/2012 | Muto | G01D 5/145 324/207.12 |
| 2016/0216132 A1* | 7/2016 | Ausserlechner | G01D 5/14 |
| 2017/0241802 A1* | 8/2017 | Ausserlechner | G01D 5/145 |
| 2017/0268864 A1 | 9/2017 | Deak et al. | |
| 2018/0087926 A1* | 3/2018 | Ausserlechner | G01D 5/165 |
| 2019/0242956 A1* | 8/2019 | Przytarski | G01D 5/16 |

FOREIGN PATENT DOCUMENTS

| | | |
|---|---|---|
| DE | 102015107711 A1 | 11/2015 |
| DE | 102018130723 A1 | 6/2020 |
| EP | 1876422 A1 | 1/2008 |

* cited by examiner

*Primary Examiner* — Alvaro E Fortich

(74) *Attorney, Agent, or Firm* — Harrity & Harrity, LLP

(57) ABSTRACT

A magneto-resistive angle sensor system for measuring a rotational angle of a rotating component in an out-of-shaft configuration. The magneto-resistive angle sensor system including a magnet, which is attached to the rotating component. The magneto-resistive angle sensor system further including a magneto resistive sensor. A sensitive plane of the magneto-resistive sensor is positioned with an offset to the center of the magnet in an offset direction.

20 Claims, 6 Drawing Sheets

MAGNETO-RESISTIVE ANGLE SENSOR SYSTEM AND A VEHICLE COMPRISING A MAGNETO-RESISTIVE ANGLE SENSOR SYSTEM

RELATED APPLICATION

This application claims priority to German Patent Application No. 102020133041.3, filed on Dec. 10, 2020, which is incorporated herein by reference in its entirety.

FIELD

Examples relate to magneto resistive angle sensor systems and vehicles comprising the magneto resistive angle sensor system.

BACKGROUND

Magneto resistive (MR) angle sensor systems have a broad range of possible applications. For example, MR angle sensor systems are used in automotive applications. Their fields of use range from steering angle applications with the highest functional safety requirements to motors for wipers, pumps and actuators and electric motors in general. They are also ready to be used in industrial and consumer applications like robotics or gimbal.

MR angle sensor systems are based on integrated magneto resistive technologies. Magnetoresistance is the tendency of a material to change the value of its electrical resistance in an externally-applied magnetic field. There are a variety of effects that can be called magnetoresistance, for example AMR, anisotropic magnetoresistance; GMR, giant magnetoresistance; and TMR, tunnel magnetoresistance. MR angle sensor systems measure a rotational angle of a rotating component. A MR angle sensor system includes a MR sensor, which detects the rotational angle of the rotating component with a magnet attached thereon by measuring sine and cosine components of a magnetic field generated by the magnet. Measuring the magnetoresistance if the magnet is attached to the rotating component in an EOS, end of shaft, configuration is often used to detect the rotational angle. In the EOS configuration, the magnet is attached to an end of a shaft of the rotating component and the MR sensor is arranged in the proximity to the end of the shaft of the rotating component within some applications, using the EOS configuration is not possible due to, for example, given geometrical restrictions regarding the arrangement of the used components. Another possibility is measuring the magnetoresistance in an out of shaft, OOS, configuration. In the OOS configuration, the magnet may be arranged at the surrounding surface of the rotating component and the MR sensor is arranged in the proximity to the magnet. Measuring in this OOS configuration may result in reduced measuring accuracy since the setup is no longer symmetric. While some applications may demand OOS configurations for geometrical reasons, a reduced accuracy of a conventional OOS configuration might prohibit the use of the OOS configuration.

SUMMARY

Therefore, there is a need to provide a more accurate way to measure the rotational angle of the rotating component in the OOS configuration, which is suitable for many applications.

This need is addressed by the subject matter of the independent claims.

An example relates to a magneto resistive, MR, angle sensor system for measuring a rotational angle of a rotating component in the out of shaft, OOS, configuration. The MR angle sensor system includes a magnet, which is attached to the rotating component, and a magneto resistive sensor. A sensitive plane of the MR sensor is positioned with an offset to the center of the magnet in an offset direction. By positioning the sensitive plane of the MR sensor with the offset in the offset direction to the center of the magnet the accuracy of the measurement of the rotational angle of the rotating component may be improved. The offset may determine a relation of magnetic field components of a first and a second direction used to determine the rotational angle. A difference between the magnetic field components in the first and the second direction may become smaller due to the offset, resulting in the possibility to determine the rotational angle with high accuracy.

BRIEF DESCRIPTION OF THE DRAWINGS

Some examples of systems will be described in the following by way of example only, and with reference to the accompanying figures, in which.

DETAILED DESCRIPTION

Figure 1A:
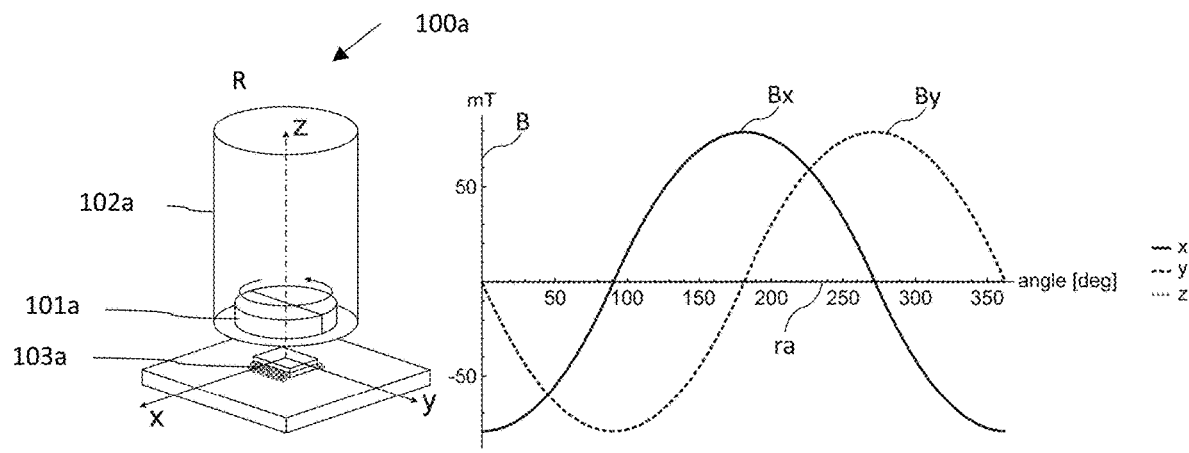
FIG. 1A shows a conventional magneto resistive, MR, angle sensor system in an end-of-shaft configuration and the dependence of a magnetic field component in a first direction and a second direction on a rotational angle.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1A shows in the left drawing a conventional magneto resistive angle sensor system 100a in an EOS, end of shaft, configuration. The MR angle sensor system 100a comprises a magnet 101a, which may be disc-shaped. The magnet 101a is attached to a rotating component 102a. The rotating component 102a may have a cylinder shape. The rotating component 102a may have a shaft extending in its lengthwise direction, which is parallel to a rotating axis R of the rotating component 102a. In the EOS configuration the magnet 101a is arranged at an end of the shaft of the rotating component 102a. The MR angle sensor system 100a further comprises a magneto resistive, MR, sensor 103a for measuring a rotational angle of the rotating component 102a. The MR sensor is sensitive to magnetic field components Bx in at least a first direction x, and magnetic field components By in at least a second direction y perpendicular to the first direction x. A sensitive plane of the MR sensor 103a is formed by the first direction x and second direction y. The rotation axis R may be perpendicular to the sensitive plane. The sensitive plane of the MR sensor may be positioned in the EOS configuration below the end of the shaft of the rotating component 102a, where the magnet 101a is attached to the rotating component 102a.

FIG. 1A shows in the right diagram a dependence of the magnetic field components Bx in the first direction x and the magnetic field components By in the second direction y on the rotational angle ra. The magnetic field component Bx in the first direction x and the magnetic field component By in the second direction y, shown in the right diagram shown in FIG. 1a, are measured with the conventional MR angle sensor system 100a in the EOS configuration shown in the left drawing of FIG. 1a. The first direction x and the second direction y may be perpendicular to a third direction z, which may be parallel to the shaft and the rotation axis R of the rotating component 102a. As can be seen in the right diagram of FIG. 1a, an amplitude of the magnetic field component Bx in the first direction x corresponds at least essentially to an amplitude of the magnetic field component By in the second direction y.

A calibration method is used to calculate the rotational angle ra. The calibration method uses the magnetic field components Bx, By, measured with the MR sensor 103a to calculate the rotational angle ra. Parameters affecting the angle calculation are offset, amplitude and non-orthogonality of the magnetic field components Bx in the first direction x and the magnetic field components By in the second direction y. The offset is a constant, additive or subtractive amount or systematic error of a measured value, in this case the magnetic field components Bx in the first direction and the magnetic field components By in the second direction. The non-orthogonality is a phase difference of the magnetic field components in the first direction x for example having a cosine signal, and in the second direction y, for example having a sine signal. The calibration method may include an offset correction, an amplitude normalization and a correction of the non-orthogonality. The offset correction shifts the amplitudes of the magnetic field component Bx of the first direction x and the magnetic field components By in the second direction y relative to an ordinate by the amount of the offset. The amplitude normalization corrects the amplitudes such that the amplitude of the magnetic field components Bx of the first direction x and the magnetic field components By in the second direction y have at least essentially the same amount. The correction of the non-orthogonality corrects the phase-shift of the magnetic field components Bx in the first direction x, for example having the cosine signal, and the magnetic field components By in the second direction y, for example having the sine signal, to at least essentially 90°.

Due to the equal size of the magnetic field components Bx, By in the EOS configuration, there may be a low error on the measured rotational angle ra of the rotating component 102a using the calibration method, resulting in a high accuracy of the measurement in the EOS configuration. Unfortunately, not all applications allow an MR angle sensor system 100a to measure the rotational angle in the EOS configuration.

Figure 1B:
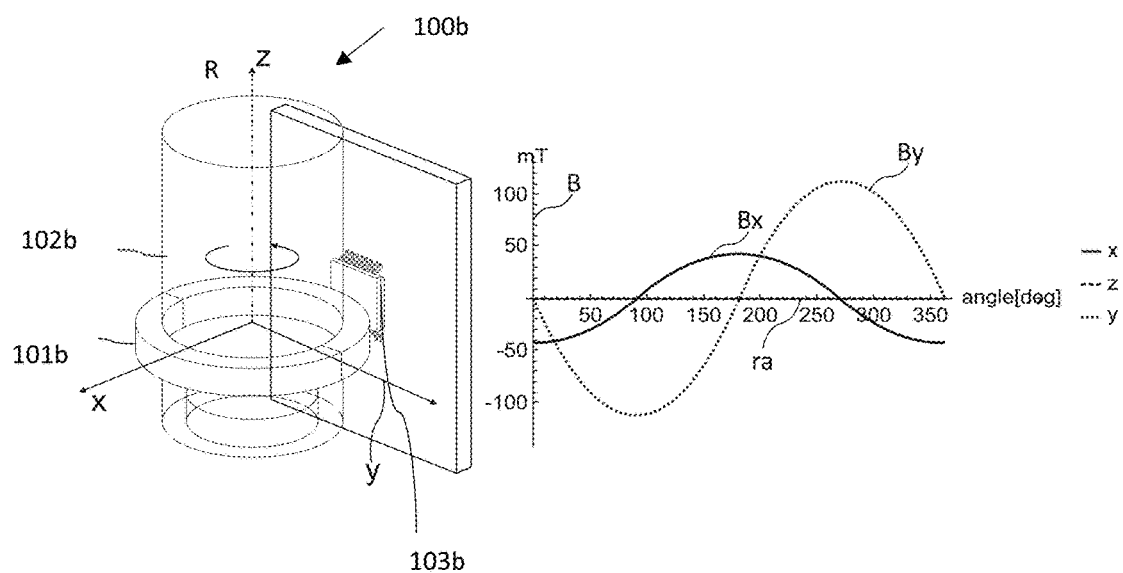
FIG. 1B shows in a conventional MR angle sensor system in an OOS, out-of-shaft configuration and the dependence of a magnetic field component in a first direction and a second direction on a rotational angle.

FIG. 1B shows in a left drawing a conventional MR angle sensor system 100b in an OOS configuration. The magnet 101b in this OOS configuration differs from the magnet 101a in the MR angle sensor system 100a shown in the left drawing of FIG. 1A in that the magnet 101b may be ring shaped and is arranged at the surrounding surface of the rotating component 102b. The MR sensor 103b is arranged in the proximity to the magnet 101b.

In a right diagram of FIG. 1B a dependence of a magnetic field component Bx in a first direction x and a magnetic field component By in a second direction y on a rotational angle ra of the rotating component 102b is shown. The magnetic field component Bx in the first direction x and the magnetic field component By in the second direction y, shown in the right diagram in FIG. 1b, are measured with the conventional MR angle sensor system 100b in the OOS configuration. In contrast to the EOS configuration in the right diagram of FIG. 1A the OOS configuration in the right diagram of FIG. 1B shows that an amplitude of the magnetic field component Bx in the first direction x differs from an amplitude of the magnetic field component By in the second direction y significantly. In this OOS configuration one of the amplitudes of the magnetic field components Bx in the first direction x and the magnetic field components By in the second direction y may become smaller than the other one.

Figure 1C:
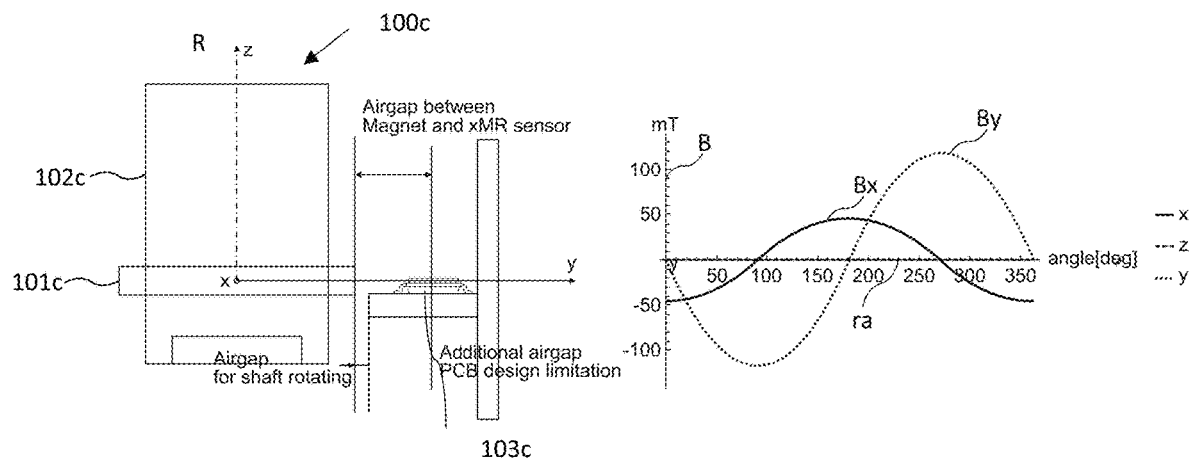
FIG. 1C shows a conventional MR angle sensor system in an OOS configuration, in which a MR sensor and a magnet are arranged parallel and the dependence of a magnetic field component in a first direction and a second direction on a rotational angle.

FIG. 1C shows in a left drawing another conventional MR angle sensor system 100c in an OOS configuration. The conventional MR angle sensor system 100c shown in the left drawing of FIG. 1C differs from the conventional MR angle sensor system 100b shown in the left drawing of FIG. 1B in that a sensitive plane of an MR sensor 103c as well as a PCB, printed circuit board, are arranged parallel to a magnet 101c. There is an airgap for shaft rotation of the rotating component 102c between the magnet 101c and the MR sensor 103c. Apart for that the conventional MR angle sensor system 100c shown in the left drawing of FIG. 1C corresponds at least essentially to the conventional MR angle sensor system 100b shown in the left drawing of FIG. 1b.

In a right diagram of FIG. 1c a dependence of a magnetic field component Bx in a first direction x and a magnetic field component By in a second direction y on a rotational angle ra of the rotating component 102c is shown. The magnetic field component By in the first direction x and the magnetic field components By in the second direction y are measured with the conventional MR angle sensor system 100c in the OOS configuration shown in the left drawing of FIG. 1c. In contrast to EOS configuration in the right diagram of FIG. 1A the OOS configuration in the right diagram of FIG. 1c shows that an amplitude of the magnetic field component Bx in the first direction x differs from an amplitude of the magnetic field component By in the second direction y significantly, very much like in the implementation of FIG. 1B.

The calibration method for calculating the rotational angle ra in the EOS configuration does not work properly in the OOS configuration, due to the fact that one of the magnetic field components Bx, By may become smaller in the OOS configuration than the other one. The amplitude normalization, used in the calibration method, may result in a high error for the measured rotational angle ra if the amplitudes of the magnetic field components Bx, By have an unequal size. Due to this relation of the amplitude of the magnetic field components Bx, By in this OOS configuration, a low accuracy of the measurement of the rotational angle ra may be experienced.

Figure 1D:
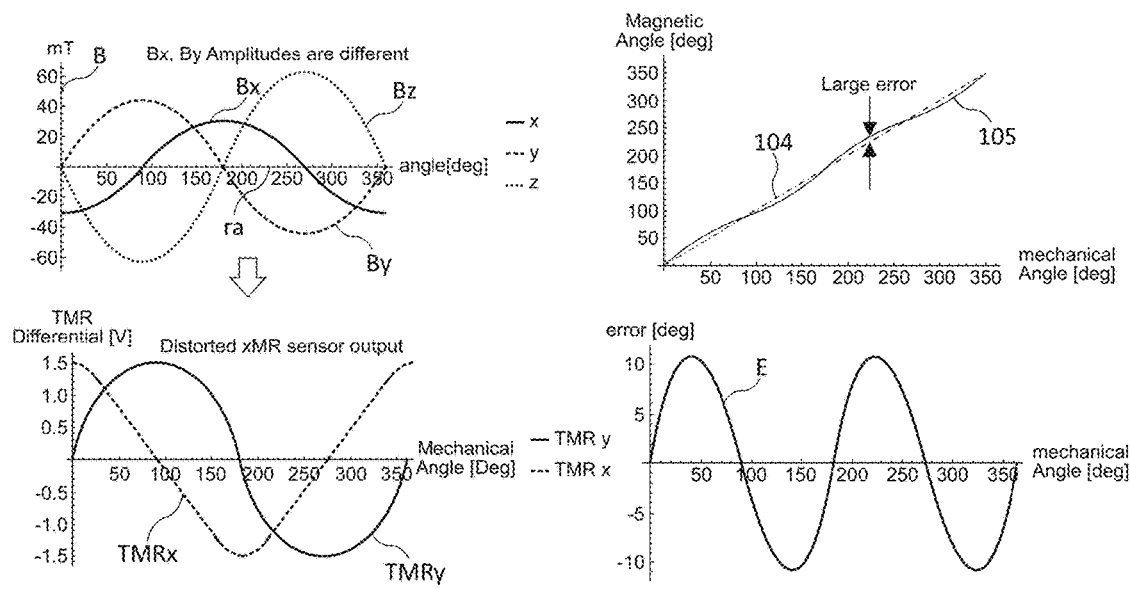
FIG. 1D illustrates a dependence of an error of the measured rotational angle on the mechanical angle in a conventional system.

FIG. 1D shows the low accuracy of the measurement of the rotational angle ra in the OOS configuration. FIG. 1D shows in a left upper diagram a dependence of the magnetic field components Bx, By and Bz on the rotational angle ra measured with the conventional MR angle sensor system 100c shown in FIG. 1C. The amplitudes of the magnetic field components Bx, By and Bz differ significantly from each other. Conventionally, MR angle sensor systems are operated in a saturated field zone. While conventional MR sensor calibration methods may compensate the amplitude of MR sensor outputs, offset, and orthogonality, conventional amplitude normalization may result in a high error for the measured rotational angle if the amplitudes of the magnetic field components Bx, By and Bz have an unequal size since the magnetic field sensors are operated in a saturated field zone. Therefore, conventional calibration methods may not work properly in a MR angle sensor system illustrated in FIG. 1C, since the sensor output for the magnetic field component Bx and the magnetic field component By in may be not proportional to the applied B-filed amplitude in a saturated zone.

The left lower diagram of FIG. 1d shows such a distorted MR sensor output TMRx, TMRy of the conventional MR angle sensor system 100c shown in FIG. 1C depending on the mechanical angle. The MR sensor output TMRx, TMRy is distorted unequally in the saturated zone resulting in unequal amplitudes of the magnetic field components Bx, By and thus in a large error of the measured rotational angle ra.

In a right upper diagram of FIG. 1D a dependence of a magnetic angle on the mechanical angle is shown of the rotational component 102c when measured with the conventional MR angle sensor system 100c of FIG. 1C. A dashed line 104 in the left drawing of FIG. 1C shows a theoretical dependence of the measured magnetic angle from the mechanical angle of the rotational component, which is, of course, linear. The magnetic angle or rotational angle defines an angle of the rotating component 102c, which is measured by the MR angle sensor system 100c. The mechanical angle defines a mechanically measured angle of the rotating component 102c. A continuous line 105 shows the values measured with the conventional MR angle sensor system 100c. The difference between the dashed line 104 and the continuous line 105 is the error of the measured rotational angle, which is significant and caused mainly by the distorted sensor output illustrated in the lower left graph of FIG. 1D.

The lower right diagram of FIG. 1D shows the dependence of the error E of the measured rotational angle from a mechanical angle of the rotating component. Due to the shape of the distorted signals in the lower left graph, the error E is maximal for the mechanical angles 45°, 135°, 225° and 315°.

In summary, conventional MR sensor systems 100b, 100c have drawbacks for measuring the rotational angle in the OOS configuration. Thus, there is a need for an MR angle sensor system, which allows a high measurement accuracy in the OOS configuration.

Figure 2A:
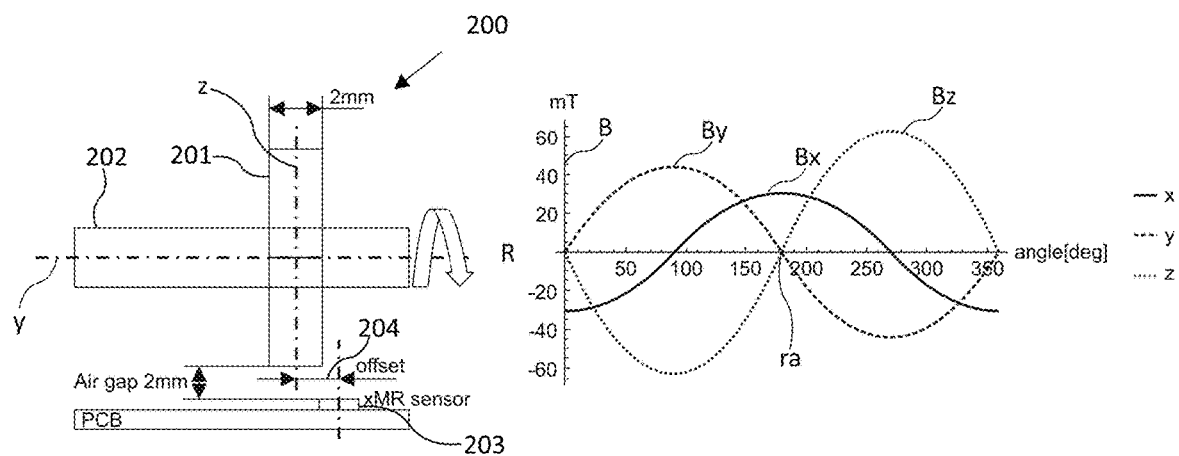
FIG. 2A shows a MR angle sensor system in an OOS configuration according to a first embodiment of the present disclosure and in a dependence of a magnetic field component in a first direction, a second direction and a third direction on a rotational angle.

This need is meet by the MR angle sensor system 200, shown in FIG. 2A. FIG. 2A shows a MR angle sensor system 200 for measuring a rotational angle of a rotating component 202 in an OOS configuration according to a first embodiment of the present disclosure. The rotating component 202 may, for example, be a cylinder-shaped shaft. Alternatively, the rotating component 202 may have any shape, which is required by a given application. For example, the rotating component 202 may have a cuboid, cone, truncated cone, prism, sphere or pyramid shape. In the illustrated embodiment, the rotating component 202 has a rotation axis R, which is parallel to a lengthwise direction of the rotating component 202.

The MR angle sensor system 200 comprises a magnet 201, which is attached to the rotating component 202. The magnet 201 has a ring shape. In alternative embodiments, the magnet 201 may have any shape which is required by the given application. For example, the magnet 201 may have a torus or a hollow cylinder shape. The magnet 201 is arranged at the outer surface of the rotating component 202. The magnet 201 may have a depth of 2 mm. The magnetic poles of the magnet 201 may be configured to be pivotable, for example about the rotation axis. A direction between the magnetic poles of the magnet 201 may be essentially perpendicular to the rotation axis R. Thereby, the rotational angle may be measured with high accuracy.

The MR angle sensor system 200 further comprises a MR sensor 203. The MR sensor 203 may be one of an anisotropic magnetoresistance sensor, a giant magnetoresistance sensor, or a tunnel magnetoresistance sensor. The MR sensor 203 is configured to measure a magnetic field component in a first direction x and in a second direction y, which is perpendicular to the first direction x. The first x and the second direction y form a sensitive plane of the MR sensor 203. The sensitive plane of the MR sensor 203 is positioned with an offset 204 to the center of the magnet 201 in an offset direction. Positioning the MR sensor 203 in this way with the non-zero offset may lead to the equal amplitude of the magnetic field components in the first direction x and the second direction y. Thus, the amplitude normalization in the calibration method is not required and may result in low error for the measured rotational angle if the amplitudes of the magnetic field components of the first direction x and the second direction y have the equal size. Therefore, a higher accuracy of the calibration method and thus a higher accuracy of the measured rotational angle in the OOS configuration may be achieved.

The offset direction is parallel to the rotation axis R of the rotating component 202 in the MR angle sensor system 200 in FIG. 2A. Alternatively, the offset direction may be perpendicular to the rotation axis R of the rotating component 202. In both cases the MR sensor 203 may be able to measure the amplitudes of the magnetic field components Bx in the first direction x and the magnetic field components By in the second direction y. In these cases, an arrangement of the MR sensor 203 relative to the magnet 201, that may allow a reliable measurement of the rotating angle of the rotating component 202 with a high accuracy, may be provided.

The first direction x and the second direction y may be perpendicular to a direction between the magnetic poles of the magnet 201. Alternatively, the first direction x or the second direction y may be parallel to the direction between the magnetic poles of the magnet 201. These cases may provide options to define the sensitive plane of the MR sensor 203 relative to the magnet 201 to measure the rotational angle with high accuracy.

Between the MR sensor 203 and the magnet 201 may be an air gap present in a direction perpendicular to the offset direction. The air gap may be for example at most 1 mm, at most 2 mm, at most 4 mm, at most 5 mm, at most 7 mm or at most 10 mm. Air gaps with these sizes allow an exact measurement of the magnetic field component in the first and the second direction y.

The MR angle sensor system 200 may further comprise a printed circuit board, PCB. The MR sensor 203 may be arranged on the PCB.

The MR angle sensor system 200 may further comprise circuitry configured to receive information on the magnetic field components measured by the MR sensor 203 and to determine a direction of the magnet based on the information on the measured magnetic field components. The circuitry may comprise a processing circuit. The processing circuit may be configured to determine the rotational angle out of the magnetic field components in the first x and second direction y. This may enable measuring the rotational angle with high accuracy. The MR sensor 101c, 102c, 103c may be implemented as a single chip, which is configured to determine the rotational angle based on the magnetic field components Bx in the first direction x and the magnetic field components By in the second direction y. Thus, the computations performed to derive the angle from the measured field components are performed within the chip comprising the magnetic field sensors.

Alternatively, the rotational angle may be determined by a separate circuit or chip. Such a separate circuit may comprise an interface to receive the measured amplitudes of the magnetic field components Bx in the first direction x and the magnetic field components By in the second direction y from the MR sensor 101c, 102c, 103c. The separate circuit may be connected to the MR sensor 101c, 102c, 103c via interface. Furthermore, the MR sensor 101c, 102c, 103c may be configured to determine the rotational angle out of the measured amplitudes of the magnetic field components Bx in the first direction x and the magnetic field components By in the second direction y.

Figure 2B:
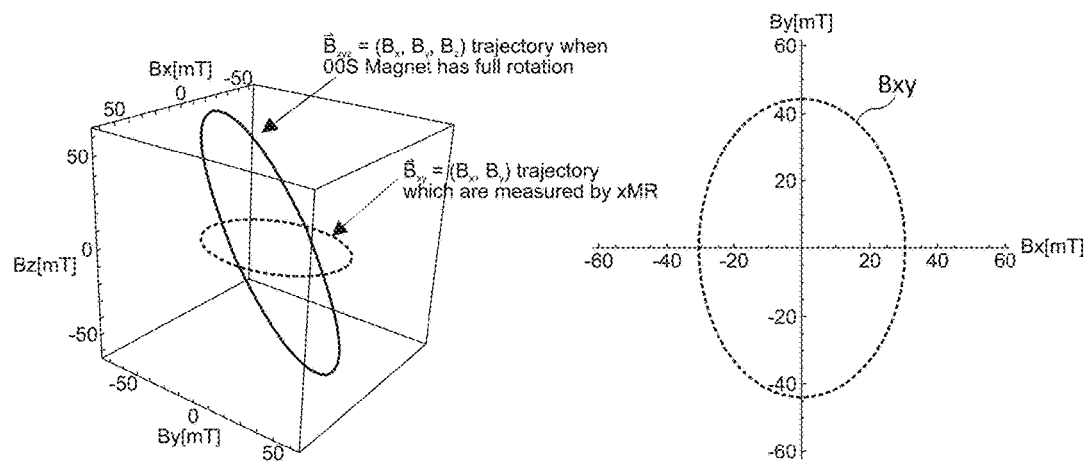
FIG. 2B shows a three-dimensional presentation of the magnetic field components and a two-dimensional presentation of the magnetic field component in the first direction and the second direction in an embodiment of the present disclosure.
Figure 2C:
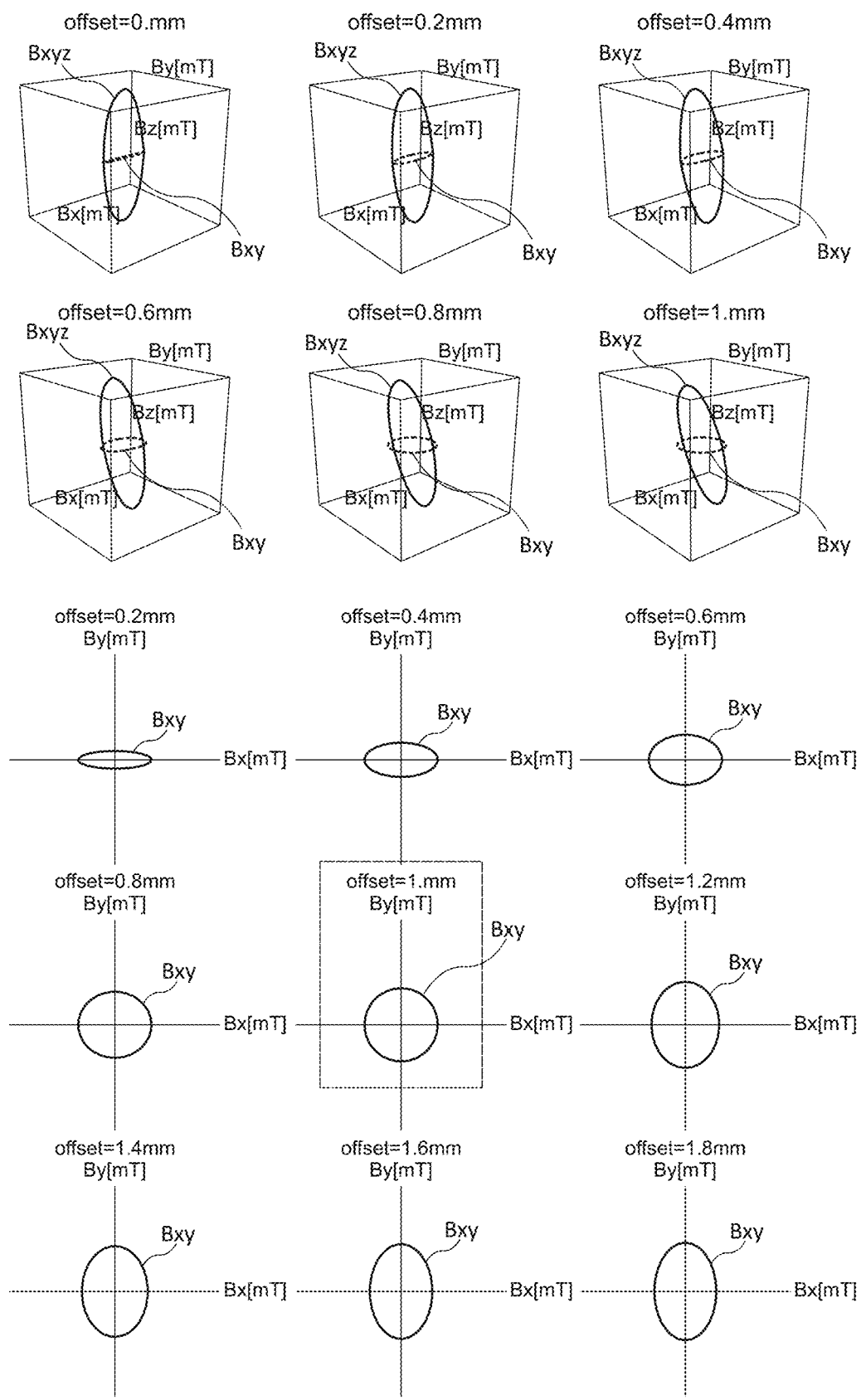
FIG. 2C shows three dimensional presentations of the magnetic field components and two-dimensional presentations of the magnetic field components for different offsets.
Figure 2D:
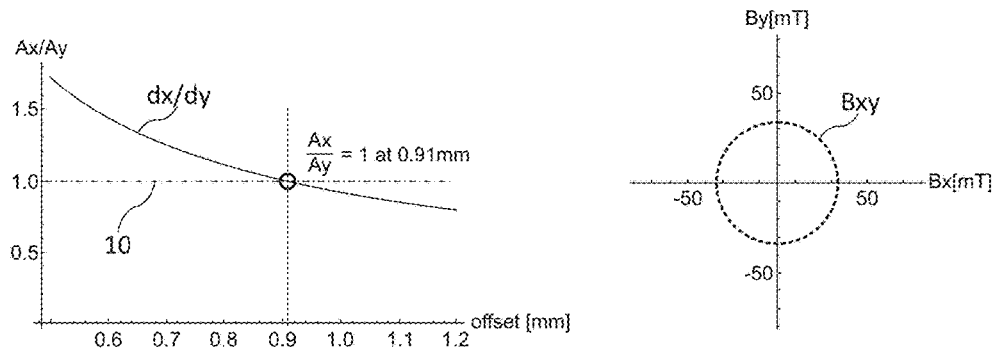
FIG. 2D shows a dependence of a ratio of an amplitude of the magnetic field components in the first direction and the second direction on an offset.

A right diagram in FIG. 2A, drawings of FIG. 2B, 2c and 2d show magnetic field components Bx, By, Bz measured with the MR angle sensor system 200 according to the first embodiment shown in the left drawing of FIG. 2A.

FIG. 2A shows in a right diagram the dependence of the magnetic field component Bx in a first direction x, the magnetic field component By in a second direction y and the magnetic field component Bz in a third direction z on a rotational angle ra. The non-zero offset 204 of the MR sensor 203 from center of magnet 201 as shown in the left diagram of FIG. 2A may generate a non-zero magnetic field component Bx in the first x, the magnetic field component By in the second y and the magnetic field component Bz in the third direction z. Hereby, the non-zero offset 204 of the MR sensor 203 from center of magnet 201 is chosen with the aim that the magnetic field components Bx in the first direction x and the magnetic field component By in the second direction y have the at least essentially equal size. Thus, a higher accuracy of the measured rotational angle may be achieved.

A left diagram of FIG. 2B shows the same components as the right diagram of FIG. 2A in a three-dimensional presentation $\vec{B}_{xyz}$. The left diagram of FIG. 2B shows the magnetic field component in the first direction x, the second direction y and the third direction z. These magnetic field components may form an ellipsoid shape trajectory in this three-dimensional presentation $\vec{B}_{xyz}$. Additionally, a two-dimensional trajectory $\vec{B}_{xyz}$ of the magnetic field components in the first x and the second direction y is shown in the left diagram of FIG. 2B. This trajectory $\vec{B}_{xyz}$ may have an inclined elliptical shape. The three-dimensional trajectory $\vec{B}_{xyz}$ of the magnetic field components in the first x, the second y and the third direction z make the inclined ellipse refer to magnetic field components in the sensitive plane formed by the first x and the second direction y with non-zero offset 204 when the magnet 201 has full rotation.

FIG. 2B shows another presentation of the magnetic field components Bx, By, Bz to be able to choose the non-zero offset 204 of the MR sensor 203 easy and reliably such that the magnetic field components Bx, By have the at least essentially equal size. FIG. 2B shows in a right diagram a top view of the inclined elliptical shape trajectory shown in the left drawing of FIG. 2B. The elliptical shape trajectory $\vec{B}_{xyz}$ is shown in a two-dimensional presentation of the magnetic field component in the first x and the second direction y. The two-dimensional trajectory $\vec{B}_{xy}$ of the magnetic field components in the first x and the second direction y and the three-dimensional trajectory $\vec{B}_{xyz}$ of the magnetic field components in the first x, the second y and the third direction z in FIG. 2b are measured, when the magnet 201 has full rotation with the non-zero offset 204.

FIG. 2C shows the magnetic field components Bx, By, Bz for different offsets 204 to achieve the aim to find the magnetic field components Bx, By having the at least essentially equal size.

FIG. 2C shows in an upper part diagrams showing a three-dimensional presentation $\vec{B}_{xyz}$ of a magnetic field component in a first direction x, a second direction y and a third direction z for different offsets. The six upper diagrams in FIG. 2C corresponding to the presentation in the left diagram of FIG. 2B.

FIG. 2C shows in a part below diagrams showing a two-dimensional presentation $\vec{B}_{xy}$ of a magnetic field component in the first direction x and the second direction y for different offsets 204. FIG. 2C shows in a lower part diagrams showing a projected ellipsoid $\vec{B}_{xyz}$ of the magnetic field component in the first x, the second y and the third direction z into the sensitive plane of the MR sensor 203 of the magnetic field component in the first x and the second direction y for different offset values 204. The nine diagrams below in FIG. 2C correspond to the presentation of the right diagram of FIG. 2B. The amount of inclination of the ellipse shaped trajectory may be controlled by the offset 204. Thus, the trajectory $\vec{B}_{xy}$ of the magnetic field component may be circle instead of ellipse shaped by having a proper offset 204, as can be seen in the diagram below in FIG. 2c. The aim to find the magnetic field components Bx, By having the at least essentially equal size, is achieved for the offset 204 with the circular trajectory $\vec{B}_{xy}$ of the magnetic field components. The trajectory of the magnetic field component $\vec{B}_{xy}$ with the offset 204 of 1 mm is circle. Thus, this circular trajectory $\vec{B}_{xy}$ resulting in a high measurement accuracy of the rotational angle ra in the OOS configuration.

FIG. 2D shows another presentation which enables the user to choose the offset 204 fulfilling the condition that the magnetic field components Bx, By having the at least essentially equal size. FIG. 2D shows in a left diagram a dependence of a ratio dx/dy of an amplitude of the magnetic field component in the first direction x and the second direction y versus an offset 204. In this diagram an offset 204, which fulfills the condition that the amplitude of the magnetic field component in the first direction x at least essentially corresponds to the amplitude of the magnetic field component in the second direction y, is marked 10. This condition is fulfilled if dx/dy is at least essentially 1. This offset 204 may have a value of for example 0.91 mm. The sensitive plane of the MR sensor 203 is positioned with this offset 204 to the center of the magnet 201 in an offset direction. This arrangement of the MR sensor 203 with the offset 204 to the magnet 201 may enable to measure the rotational angle ra of the rotating component 202 like in the EOS configuration with existing typical calibration method by keeping high accuracy. The offset value, which make the ratio of the amplitude of the magnetic field component in the first x and the second direction y at least essentially one always exists. The MR sensor 203 requires that the amplitude ratio fulfills this condition for high accuracy application.

FIG. 2D shows in a right diagram a two-dimensional presentation $\vec{B}_{xy}$ of the magnetic field component in the first direction x and the second direction y. The presentation in the right diagram of FIG. 2D corresponds to the presentation in the left diagram of FIG. 2B and the nine diagrams in the lower part of FIG. 2C. The right diagram of FIG. 2D shows the dependence of the magnetic field component in the first direction x on the magnetic field component in the second direction y at the offset 204, which is marked in the left diagram of FIG. 2D and fulfills the condition that the amplitude of the magnetic field component in the first direction x at least essentially corresponds to the amplitude of the magnetic field component in the second direction y. At this offset the right diagram of FIG. 2D has the circular shape.

Thus, choosing the proper offset is important in OOS configuration to achieve the high accuracy of the measured rotational angle ra. In the OOS configuration a non-zero offset between the MR senor 203 and the magnet 201 may be applied to induce non-zero magnetic field components in the first x and the second direction y. The MR sensor 203 is placed with the non-zero offset to the magnet 201 which makes the ratio of the amplitude of the magnetic field component in the first direction x and in the second direction y at least essentially equal 1 for high accuracy application.

Alternatively, the offset may be chosen such that the ratio of the amplitude of the magnet field component in the first direction x and the amplitude of the magnet field component in the second direction y is in one of the ranges 0.85 to 1.15; 0.9 to 1.1, or 0.95 to 1.05 at the position of the MR sensor 203. In this case a high measurement accuracy of the MR sensor 203 may be achieved. A mapping calibration method may be applied with non-ideal offset which may not make the ratio of the amplitude of the magnetic field component in the first direction x and the second direction y 1. However, it also has to have the non-zero offset.

More details and aspects are mentioned in connection with the embodiments described above or below. The example shown in the left drawing of FIG. 2A may comprise one or more optional additional features.

Figure 3A:
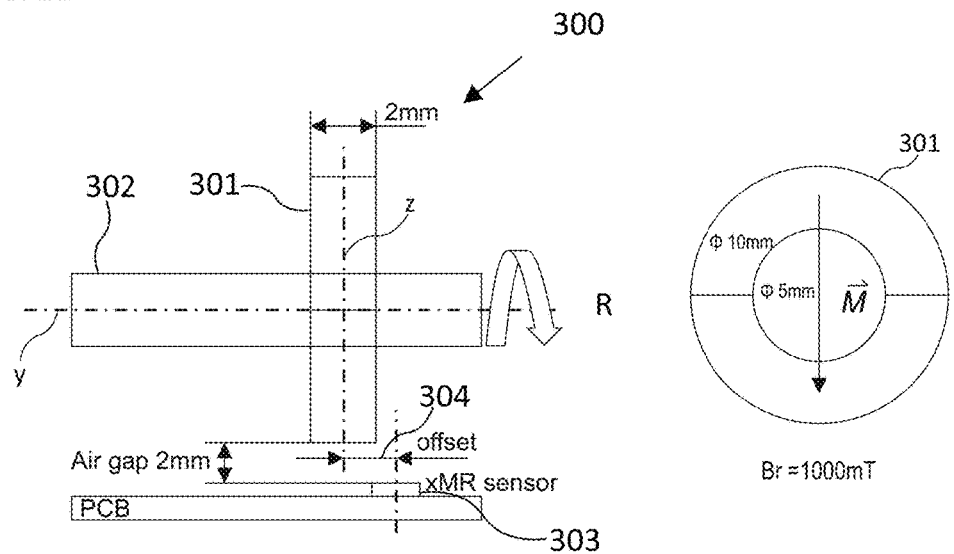
FIG. 3A shows a MR angle sensor system in an OOS configuration according to a second embodiment of the present disclosure and a magnet of the MR angle sensor system according to the second embodiment.

FIG. 3A shows in a left drawing a MR angle sensor system 300 in an OOS configuration according to a second embodiment of the present disclosure for an OOS rotor position sensing application. Rotor position sensing is a system for precise measurement of a rotor position. The MR angle sensor system 300 according to the second embodiment differs from the MR angle sensor system 200 according to the first embodiment shown in FIG. 2A left drawing, in that the magnet 301 is a ring magnet 301, which is ring-shaped as shown in a right drawing of FIG. 3A. Thereby, the MR angle sensor system 300 according to the second embodiment is configured for rotor position sensing. The ring magnet 301 may have an inner diameter of 5 mm and/or an outer diameter of 10 mm. The magnet 301 may have a magnetic flux density of 1000 mT. Apart from that the MR angle sensor system 300 according to the second embodiment corresponds to the MR angle sensor system 200 according to the first embodiment.

Figure 3B:
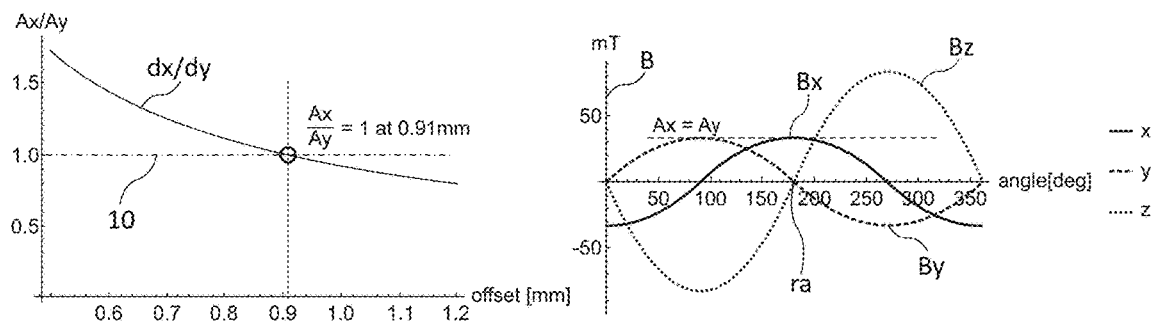
FIG. 3B shows a dependence of a ratio of an amplitude of a magnetic field component in a first direction and a second direction on offset and the dependence of the magnetic field components on a rotational angle.
Figure 3C:
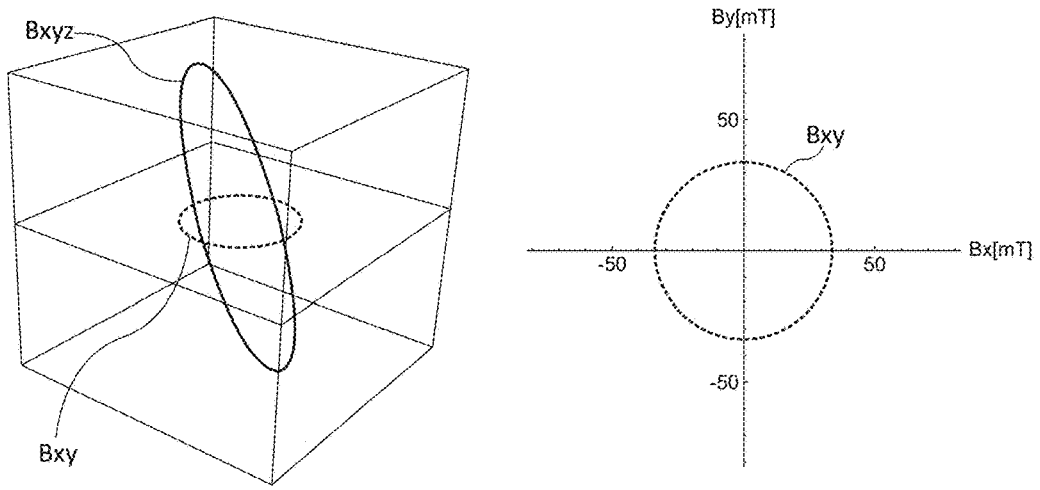
FIG. 3C shows a three-dimensional presentation of the magnetic field component and a two-dimensional presentation of the magnetic field component in the first direction and the second direction.
Figure 3D:
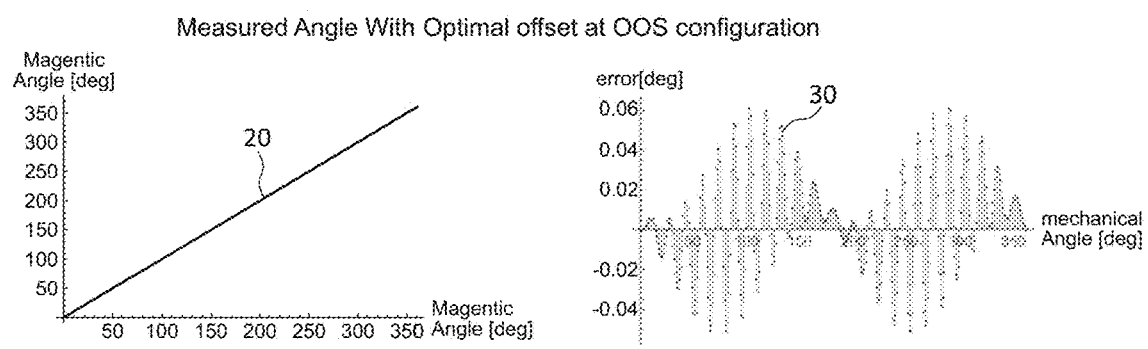
FIG. 3D shows the dependence of a magnetic angle on a mechanical angle in the OOS configuration and the dependence of an error of the magnetic angle on the mechanical angle in the OOS configuration.

FIG. 3B, 3c and 3d show, how to choose the proper offset in this MR angle sensor system 300 for the OOS rotor position sensing. FIG. 3B shows in a left diagram the dependence of a ratio dx/dy of an amplitude of a magnetic field component Bx, By versus an offset 304 measured with the MR angle sensor system 300 according to the second embodiment. In this diagram the offset, which fulfills the condition that the amplitude of the magnetic field component Bx in the first direction x at least essentially corresponds to the amplitude of the magnetic field component By in the second direction y, is marked 10. This condition is fulfilled if dx/dy is at least essentially 1. This offset 304 may have a value of for example 0.91 mm.

FIG. 3B shows in a right diagram the dependence of a magnetic field component in a first direction x, a second direction y and a third direction z measured with the MR angle sensor system 300 according to the second embodiment on a rotational angle. As shown in the right diagram of FIG. 3B the amplitude of the magnetic field component Bx in the first direction x corresponds at least essentially to the amplitude of the magnetic field component By in the second direction y. Thus, the chosen offset achieves the aim that the magnetic field components Bx, By having the at least essentially equal size. This results in the high measurement accuracy of the rotational angle ra in the OOS rotor position sensing using the calibration method.

FIG. 3C shows in a left diagram a three-dimensional presentation of the magnetic field component in the first direction x, the second direction y and a third direction z measured with the MR angle sensor system 300 according to the second embodiment. A trajectory of the magnetic field components in three dimensions $\vec{B}_{xyz}$, is ellipsoid shape, as shown in the left diagram of FIG. 3C. Also shown in the left diagram of FIG. 3C is a trajectory $\vec{B}_{xy}$ of the magnetic field component in the first x and the second direction y, which is circular. This trajectory is also shown in a two-dimensional presentation $\vec{B}_{xy}$ in a plan view in a right diagram of FIG. 3C. The right diagram of FIG. 3C shows the magnetic field component $\vec{B}_{xy}$ in the first direction x and the second direction y measured with the MR angle sensor system 300 according to the second embodiment, which is circular. This circular trajectory $\vec{B}_{xy}$ shows that the magnetic field components Bx, By having the at least essentially equal size resulting in the high measurement accuracy of the rotational angle ra in the OOS rotor position sensing.

FIG. 3D shows the measured rotational angle with an optimal offset 304 in the OOS rotor position sensing. The optimal offset 304 achieves the aim that the magnetic field components Bx, By having the at least essentially equal size. FIG. 3D shows in a left diagram a dependence of a magnetic angle or rotational angle on a mechanical angle 20 in the OOS configuration. The magnetic angle is measured with the MR angle sensor system 300 according to the second embodiment. As can be seen in the left diagram of FIG. 3D the dependence between the magnetic angle and the mechanical angle 20 is linear and has no offset. Thus, a proper calibration is achieved using this offset 304.

FIG. 3D shows in a right diagram a dependence of an error of the magnetic angle 30 measured with the MR angle sensor system 300 in the OOS configuration according to the second embodiment on the mechanical angle. As can be seen in the right diagram of FIG. 3D the dependence of the error of the magnetic angle on the mechanical angle 30 is polynomial with the optimal offset 304. Thus, the MR sensor 303 may achieve a high accuracy rotational angle measurement in the OOS rotor position sensing according to this simulation by only having proper offset 304 positioning.

More details and aspects are mentioned in connection with the embodiments described above or below. The example shown in the left drawing of FIG. 3A may comprise one or more optional additional features.

Figure 4:
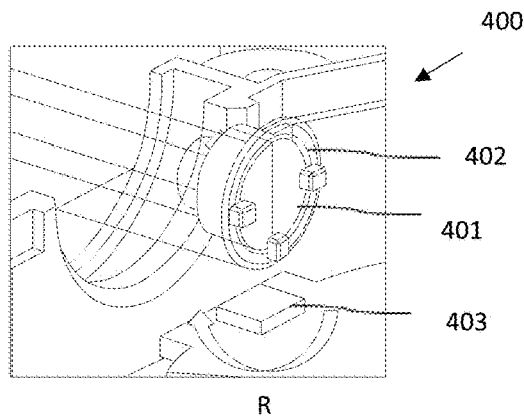
FIG. 4 shows a part of a vehicle comprising a MR angle sensor system in an OOS configuration in a SBW, shift by wire, application according to a third embodiment of the present disclosure.

FIG. 4 shows a part of a vehicle comprising an MR angle sensor system 400 in an OOS SBW, shift by wire, application according to a third embodiment of the present disclosure. Shift by wire is a system by which the transmission modes may be changed in a car through electronic controls without any mechanical linkage between the gear shifting lever and the transmission. This may eliminate routing space required for housing the mechanical linkages between the shifter and the transmission and may provide effortless shifting through the press of a button or through knobs. Elimination of this linkage may remove any shift effort from the driver's gear selection. The MR angle sensor system 400 according to the third embodiment differs from the MR angle sensor system 200, 300 according to the first and second embodiment in that it is configured for SBW applications. Besides this the MR angle sensor system 400 according to the third embodiment further comprises a rotating shaft forming the rotating component 402. The rotating shaft may be one of a camshaft, a crankshaft, a steering shaft, or a shaft of a human interface controller. Hereby, different rotating shafts suitable for different applications may be provided. The magnet 401 may be disc shaped and arranged at an end of the rotating shaft 402. A rotation axis R of the rotating shaft may be parallel to a lengthwise direction of the rotating shaft. Apart from that the MR angle sensor system 400 according to the third embodiment corresponds to the MR angle sensor system 200 according to the first embodiment.

Also, this MR angle sensor system 400 requires the offset to achieve the aim that the magnetic field components Bx, By having the at least essentially equal size. This results in the high measurement accuracy of the rotational angle ra using the calibration method in the OOS SBW.

More details and aspects are mentioned in connection with the embodiments described above or below. The example shown in the FIG. 4 may comprise one or more optional additional features.

The aspects and features described in relation to a particular one of the previous examples may also be combined with one or more of the further examples to replace an identical or similar feature of that further example or to additionally introduce the features into the further example.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended.

What is claimed is:

1. A magneto-resistive angle sensor system for measuring a rotational angle of a rotating component in an out-of-shaft configuration, the magneto-resistive angle sensor system comprising:
   a magnet that is attached to the rotating component, the magnet comprising a center and magnetic poles; and
   a magneto-resistive sensor configured to measure a magnetic field component of a magnetic field of the magnet in a first direction and a second direction, the first direction and the second direction forming a sensitive plane that is positioned with an offset to the center of the magnet in an offset direction, the offset direction being parallel to a rotation axis corresponding to the rotating component.

2. The magneto-resistive angle sensor system according to claim 1, wherein the second direction is perpendicular to the first direction.

3. The magneto-resistive angle sensor system according to claim 2, wherein the first direction and the second direction are perpendicular to a direction that extends between the magnetic poles of the magnet.

4. The magneto-resistive angle sensor system according to claim 2, wherein the first direction or the second direction is parallel to a direction that extends between the magnetic poles of the magnet.

5. The magneto-resistive angle sensor system according to claim 2, wherein the offset of the sensitive plane is configured such that a ratio of an amplitude of a magnet field component in the first direction and an amplitude of a magnet field component in the second direction is in a range of 0.85 to 1.15, 0.9 to 1.1, or 0.95 to 1.05 at a position of the magneto-resistive sensor.

6. The magneto-resistive angle sensor system according to claim 1, wherein the offset of the sensitive plane is configured such that an amplitude of a magnet field component in the first direction corresponds substantially equal to an amplitude of a magnet field component in the second direction.

7. The magneto-resistive angle sensor system according to claim 1, wherein the magnetic poles of the magnet are pivotable.

8. The magneto-resistive angle sensor system according to claim 1, wherein a direction that extends between the magnetic poles of the magnet is substantially perpendicular to the rotation axis.

9. The magneto-resistive angle sensor system according to claim 1, wherein the magneto-resistive sensor is one of an anisotropic magnetoresistance sensor, a giant magnetoresistance sensor, or a tunnel magnetoresistance sensor.

10. The magneto-resistive angle sensor system according to claim 1, further comprising:
  circuitry configured to receive information on a plurality of magnetic field components measured by the magneto-resistive sensor and determine a direction of the magnet based on the information on the measured plurality of magnetic field components.

11. The magneto-resistive angle sensor system according to claim 1, further comprising:
  a rotating shaft forming the rotating component.

12. The magneto-resistive angle sensor system according to claim 11, wherein the rotating shaft is one of a camshaft, a crankshaft, a steering shaft, or a shaft of a human interface controller.

13. A vehicle, comprising:
  a magneto-resistive angle sensor system for measuring a rotational angle of a rotating component in an out-of-shaft configuration, the magneto-resistive angle sensor system comprising:
    a magnet that is attached to the rotating component, the magnet comprising a center and magnetic poles; and
    a magneto-resistive sensor configured to measure a magnetic field component of a magnetic field of the magnet in a first direction and a second direction, the first direction and the second direction forming a sensitive plane that is positioned with an offset to the center of the magnet in an offset direction, the offset direction being parallel to a rotation axis corresponding to the rotating component.

14. The vehicle according to claim 13, wherein the second direction is perpendicular to the first direction.

15. The vehicle according to claim 14, wherein the first direction and the second direction are perpendicular to a direction that extends between the magnetic poles of the magnet.

16. The vehicle according to claim 14, wherein the first direction or the second direction is parallel to a direction that extends between the magnetic poles of the magnet.

17. The vehicle according to claim 14, wherein the offset of the sensitive plane is configured such that a ratio of an amplitude of a magnet field component in the first direction and an amplitude of a magnet field component in the second direction is in a range of 0.85 to 1.15, 0.9 to 1.1, or 0.95 to 1.05 at a position of the magneto-resistive sensor.

18. The vehicle according to claim 14, wherein the offset of the sensitive plane is configured such that an amplitude of a magnet field component in the first direction corresponds substantially equal to an amplitude of a magnet field component in the second direction.

19. The vehicle according to claim 13, wherein the magnetic poles of the magnet are pivotable.

20. The vehicle according to claim 13, wherein a direction that extends between the magnetic poles of the magnet is substantially perpendicular to the rotation axis.

* * * * *